(12) United States Patent
Yankov

(10) Patent No.: US 8,451,871 B2
(45) Date of Patent: May 28, 2013

(54) METHOD OF MANUFACTURING A LASER DIODE WITH IMPROVED LIGHT-EMITTING CHARACTERISTICS

(76) Inventor: Vladimir Yankov, Washington Township, NJ (US)

( * ) Notice: Subject to any disclaimer, the term of this patent is extended or adjusted under 35 U.S.C. 154(b) by 0 days.

(21) Appl. No.: 13/135,108

(22) Filed: Jun. 27, 2011

(65) Prior Publication Data

US 2011/0263056 A1    Oct. 27, 2011

Related U.S. Application Data

(63) Continuation-in-part of application No. 12/592,191, filed on Nov. 23, 2009, now Pat. No. 8,085,821.

(51) Int. Cl.
*H01S 3/098* (2006.01)
(52) U.S. Cl.
USPC .................................. 372/19; 372/20; 438/29
(58) Field of Classification Search
USPC ......................................... 372/19, 20; 438/29
See application file for complete search history.

(56) References Cited

U.S. PATENT DOCUMENTS

| | | | |
|---|---|---|---|
| 4,687,285 | A | 8/1987 | Hily et al. |
| 5,940,564 | A | 8/1999 | Jewell |
| 6,031,953 | A | 2/2000 | Rekow et al. |
| 7,872,788 | B2 | 1/2011 | Yankov |
| RE42,206 | E * | 3/2011 | Mossberg et al. ............... 385/37 |
| 7,929,190 | B2 | 4/2011 | Yankov |
| 2006/0126992 | A1 | 6/2006 | Hashimoto et al. |
| 2006/0233493 | A1 | 10/2006 | Mossberg |
| 2007/0034730 | A1 | 2/2007 | Mossberg et al. |
| 2007/0053635 | A1 | 3/2007 | Iazikov et al. |
| 2009/0195778 | A1 | 8/2009 | Yankov |
| 2011/0122468 | A1 | 5/2011 | Yankov |

FOREIGN PATENT DOCUMENTS

EP          864892          9/1998

OTHER PUBLICATIONS

Yankov et al. "Digital Planar Holography and multiplexer/demultiplexer with discrete dispersion". SPIE Proceedings series (Conference Active and passive optical component for WDM commmunications III, Sep. 2003, Manuscript of Vladimir Yankov, et al., SPIE Code No. 5246-68.

* cited by examiner

Primary Examiner — Kinam Park

(57) ABSTRACT

The method of the invention is intended for manufacturing a laser diode with improved light-emitting characteristics. The method consists of providing certain components of a laser diode such as a wide-aperture lasing medium that has an active emitting layer with a first end and a second end, a DPH-mode reorganizer that contains a core and a plurality of nanogrooves made in the core and arranged in a pattern that accomplishes a given function and locally changes the refractive index of the core. The method further includes the steps of forming a semitransparent mirror on the second end of the active lasing medium and aligning the first end of the active emitting layer with the core of the DPH-mode reorganizer, thus forming a resonator of the laser diode. In the resonator, the light applied from the laser-active medium bounces back and forth between the DPH-mode reorganizer and the partially reflecting mirror, thereby enhancing stimulated emission.

9 Claims, 10 Drawing Sheets

100 micron/div 100 micron/div

METHOD OF MANUFACTURING A LASER DIODE WITH IMPROVED LIGHT-EMITTING CHARACTERISTICS

CROSS-REFERENCE TO RELATED PATENT DOCUMENTS

The present patent application is continuation-in-part of U.S. patent application Ser. No. 12/592,191 filed by the same applicant on Nov. 23, 2009 now U.S. Pat. No. 8,085,821 and entitled "Light-Enhancing Device and Method Based on Use of an Optically Active Lasing Medium in Combination with Digital Planar Holography".

FIELD OF THE INVENTION

The present invention relates to a method of manufacturing a laser device, in particular, to manufacturing a laser device with improved performance characteristics. More specifically, the invention relates to a method for manufacturing a laser diode based on a broad area cavity design and on the use of digital planar holography. The invention may be used for enhancing brightness of light produced by a device based on the use of laser diodes in combination with digital planar holograms. The aforementioned method uses a multimode laser diode in combination with a digital planar hologram and reduces the number of modes in output light with a resulting decrease in light-beam divergence without a noticeable loss of optical light power and with a resulting improvement in laser diode brightness. The method may find use in manufacture of optical devices for transmitting light energy to remote areas, treating materials by laser systems, illuminating remotely located objects with a visible and infrared light, etc. transmitting light energy to remote areas, treating materials by laser systems, illuminating remotely located objects with a visible and infrared light, etc.

BACKGROUND OF THE INVENTION

One of the problems that currently exists in the field of laser technology is insufficient quality of radiation from edge-emitting laser diodes. It is known that light beams emitted from aforementioned edge-emitting laser diodes have a complicated structure. These beams are asymmetric and exhibit different divergences in the emitter plane (slow axis) and in the plane perpendicular to the emitter plane (fast axis). Although fast-axis divergence is much greater than slow-axis divergence, the wavefront is close to a diffraction-limited spherical shape, and the beam can be easily collimated with a spherical lens. On the other hand, the slow-axis beam structure can be very complicated, and collimation is very difficult, if even possible.

The radiation structure of the aforementioned type significantly complicates formation of desired beams and their collimation and focusing on a target, as well as coupling into optical fibers. A common solution to the above problem demands the use of anamorphous optics, such as special collimators for fast and slow axes, special focusing optics, etc. However, precision collimators of this type are expensive, and this limits their use in practice. Designs of collimators for beams propagated in the direction of slow and fast axes are known and described in numerous patents, for example, in U.S. Pat. Nos. 4,687,285; 5,940,564; 6,031,953, in European Patent EP No. 864,892, etc.

The above problem is understood to be even more aggravated in laser diodes with wide emitters, i.e., with emitters having a high ratio of emitter width to emitter height. Such lasers are known as broad-area laser diodes (hereinafter referred to as BALDs). The driving force behind widening the emitter area is the desire to increase output power without damaging the output face of the laser diode. An example of such BALDs that recently appeared on the market is a device having an emitter width greater than 100 microns (slow axis) and a height of less than about 1.5 microns (fast axis). The output power of these diodes exceeds several watts and may reach tens of watts, and the structure of their radiation has a complicated multimode nature that leads to high divergence of the output beam. Conventional approaches to the solution of the above problem with respect to the wide-aperture edge-emitting laser diodes do not allow for forming single transverse mode beams without significant loss of power and with increase in weight or size. Therefore, advantages inherent in optical laser devices are not used to their full potentials for wide-aperture edge-emitting laser diodes.

In view of the above, the extremely important task in laser technology is to improve optical characteristics such as mode composition, beam divergence in the direction of slow and fast axes without noticeable reduction in optical power, and, hence, brightness.

An innovative method of controlling the optical parameters of a light beam such as direction of light propagation, change of phases, spectral dispersion, etc., as proposed in U.S. Pat. No. 7,929,190 issued to V. Yankov on Apr. 19, 2011, is the use of planar optical waveguides with quasi-continuous change in refractive index. This approach is known as digital planar holography (hereinafter referred to as "DPH"), a new technology recently developed for fabricating miniature components for integrated optics. The essence of DPH technology is the embedding of digital holograms calculated by a computer inside into a planar waveguide.

DPH allows for light propagation in the hologram plane rather than in the perpendicular direction and results in obtaining a long interaction path. Benefits of a long interaction path are well known for volume/thick hologramsOn the other hand, planar configuration provides easy access to the surface, where the hologram should be embedded, enabling a simple fabrication process.

As known, light is confined in waveguides by a refractive index gradient and propagates in a core layer surrounded with a cladding layer. Materials for core/cladding layers should be selected so that the core refractive index $N_{core}$ is greater than that of the cladding layer $N_{clad}$: $N_{core} > Ar_{clad}$. Cylindrical waveguides (optical fibers) allow for one-dimensional light propagation along the axis. Planar waveguides, which are fabricated by sequentially depositing flat layers of transparent materials with a proper refractive index gradient on a standard wafer, confining light in one direction (axis z), and permitting free propagation in two other directions (x and y axes).

A lightwave propagating through the waveguide core extends to some degree into both cladding layers. If the refractive index is properly modulated in the wave path, the light from each given wavelength can be directed to a desirable point.

DPH technology can be used for designing and fabricating holographic nanostructures inside a planar waveguide, thus providing conditions for light processing and control. There are several ways of modulating the core refractive index, the simplest of which is engraving the required pattern by means of nanolithography. Modulation is created by embedding a digital hologram on one of the core/cladding interfaces or on both of the interfaces. Standard lithographical processes can be used, making mass production straightforward and inexpensive. Nanoimprinting is another viable method for fabricating DPH patterns. Each DPH pattern is computer-generated and is customized for a given application. The DPH pattern consists of numerous nanogrooves, each about 100 nm wide, which are positioned so as to provide maximum efficiency for a specific application.

The aforementioned DPH pattern devices are fabricated on standard wafers. While the total number of nanogrooves is huge (about $10^6$), the typical size of DPH devices is on a scale of millimeters.

DPH structure can be described as a digital planar hologram that comprises an optimized combination of overlaid virtual patterns, each of which is resonant to a single wavelength of light.

SUMMARY

The method of the invention for manufacturing a laser diode with improved performance characteristics comprises the following steps:

providing a wide-aperture lasing medium that has an active emitting layer with a first end and a second end, a DPH-mode reorganizer that comprises a core, at least one cladding, and a plurality of nanofeatures made in the core in the form of holographic elements having less depth than the thickness of the core and smaller dimensions than those of the half-wavelength of light that can be emitted by the lasing medium, the nanofeatures being arranged in a pattern that accomplishes a given function and that locally changes the refractive index of the core;

forming a semitransparent mirror on the second end; and aligning the first end of the active emitting layer with the core of the DPH-mode reorganizer thus forming a resonator.

Thus, the aforementioned laser diode with improved light-emitting characteristics is formed essentially from a lasing medium, a DPH-mode reorganizer that functions as a nontransparent mirror on the first end of the active emitting layer, and a semitransparent mirror on the second end that emits light of improved characteristics emitted from the laser.

For better understanding the manufacturing method of the invention, it is advantageous to consider in more detail the structure and principle of operation of the laser diode with improved performance characteristics for manufacturing for which the method of the invention is intended. Such laser diode is described in U.S. Patent Application Publication No. 20110122468 Published on May 26, 2011 (inventor: Vladimir Yankov)

The aforementioned laser diode, with improved performance characteristics comprises a lasing medium installed on a substrate sub mount made, e.g., of silica, and a DPH-mode reorganizer, which is formed on a standard wafer substrate. Both units are supported by a mounting plate that also can be made of a suitable material of high thermal conductivity, such as ceramic.

The optically active lasing medium (a wide-aperture emitter) radiates a multimode light beam. In the context of the present patent application, the term "wide-aperture emitter" relates to an emitter that has a width ranging from 10 microns to several hundred microns and height ranging from 0.2 nm to several microns. The active lasing medium is limited on one side with a partially transparent (2%<R<10%) reflective mirror (as a rule, with coefficient of reflection of approximately R=4%) and on the other side with antireflective coating having a very low coefficient of reflection (R<0.1%) (open side).

The DPH-mode reorganizer comprises the following: (1) at least one layer of a lower cladding of $SiO_2$ having a thickness ranging from several to several tens of microns; and (2) a core placed onto the lower cladding that is made of silicon doped with a material such as germanium, which increases core refractive index and has a thickness of several nanometers to one micron. The cladding and core have different refraction indices that differ by 1 to 5%. In other words, the refraction index of the core is greater than that of the cladding. If necessary, an upper cladding can be deposited onto the core.

The core of the DPH unit comprises a plurality of holographic elements that can be produced in the form of grooves with a depth less than the thickness of the core. Preferably, the holographic elements are manufactured as rectangular grooves reproduced by methods of binary nanolithography. As mentioned above, the number of such elements can be $10^6$ or more. The total surface area occupied by these elements on the surface of the core is several $mm^2$. The elements locally change the refractive indices of the core. It is understood that if the dimensions of the elements do not exceed half of a light wavelength, the density of the elements on the core surface can be used for controlling propagation of the light beam. This means that the light beam emitted from the lasing medium can be converted, after passing through and processing inside the DPH unit, into a beam of desired parameters defined by the DPH structure and configuration.

In general, the method of generation and formation of DPH is described in U.S. Pat. No. 7,872,788, issued on Jan. 18, 2011 to Vladimir Yankov ("Method of digitally processing optical waves in integrated planar optical devices that operate on the principle of digital planar holography") and in U.S. Pat. No. 7,929,190, issued on Apr. 19, 2011 to Vladimir Yankov ("Integrated planar optical device based on digital planar holography."

A distinguishing feature of planar holograms used in the aforementioned patents is not only their binary structure but also their pattern topology which is determined by a given function of DPH, in our case the function of reorganization of modes, selection of modes, and gaining of one or several of the selected modes.

Both the lasing medium and the DPH-mode reorganizer can be mounted on a common base plate made, e.g., from Si, $SiO_2$, or quartz. To stabilize temperature in lasing media of high power, the common base plate can be made from a material of high thermal conductivity on a thermoelectric cooler. The lasing medium and the DPH-mode reorganizer are coplanar and mounted on the base plate so that the optical axis of the lasing medium (the active emitting layer of the resonator) is aligned with the optical axis of the core and the respective axis of the hologram, e.g., the symmetry axis. The gap between the open side of the lasing medium and the end face of the waveguide with DPH structure does not exceed the wavelength of the emitted light. It is understood that in the design described above, the DPH-mode reorganizer plays the role of a specific nontransparent mirror with quasi-continuous parameters distributed in the plane of waveguide in accordance with the aforementioned given function used for generation, selection, and gaining of modes.

In a conventional wide-aperture lasing medium that contains a conventional nontransparent mirror and does not contain the above-described DPH-mode reorganizer, the output beam will have a multimode nature that consists of several tens or even hundreds of various transverse lateral modes of various intensities.

The picture dramatically changes when the lasing medium is optically coupled with the specific DPH-mode reorganizer of the invention because the DPH-mode reorganizer decreases the number of modes to three, two, or one. As a result, a powerful low-order mode is formed, and the major part of the power output of the laser is concentrated in this low-order mode, while a much smaller part of the laser power is held by the remaining side modes, the total number of which is significantly reduced to three, two, or one. This mode distribution pattern is typical for the far field. Angular divergence in the direction of the slow axis also can be reduced in order of magnitude, e.g., from 20° to 2°.

BRIEF DESCRIPTION OF THE DRAWINGS

FIGS. 2A, 2B, 2C, 2D, 2E, 2F, and 2G are simplified schematic top views of the mode-reorganizing system according to the invention, the drawings illustrating interaction of the selected modes of laser radiation by using respective patterns of the DPH-mode reorganizer, wherein FIG. 2G illustrates the final pattern obtained by interposing the aforementioned respective patterns of FIGS. 2A, 2B, 2C, 2D, 2E, and 2F.

DETAILED DESCRIPTION OF THE INVENTION

Terminology used in the present specification is explained below. In the context of the present patent specification, the term "lasing medium" relates to a part of a laser-type light-emitting device, such as a laser diode, that forms the aforementioned device in combination with respective fully reflecting and/or partially reflecting mirrors.

Furthermore, although mode structures are considered in general, all modifications described below relate to lateral modes. Some important properties of laser diodes depend on the geometry of the optical cavity. Thus, in the vertical direction, light is contained in a very thin layer, and, therefore, in the direction perpendicular to the layers the structure supports only a single optical mode. In the lateral direction, however, if the waveguide is wide in comparison to the wavelength of light, the waveguide can support multiple lateral optical modes. In the latter case, such a laser is known as "multimode laser."

For better understanding the principle of the method of the invention, let us first consider in more detail the optical system of the laser device manufactured by the method of the invention and compare this system with a conventional one.

Figure 1A:
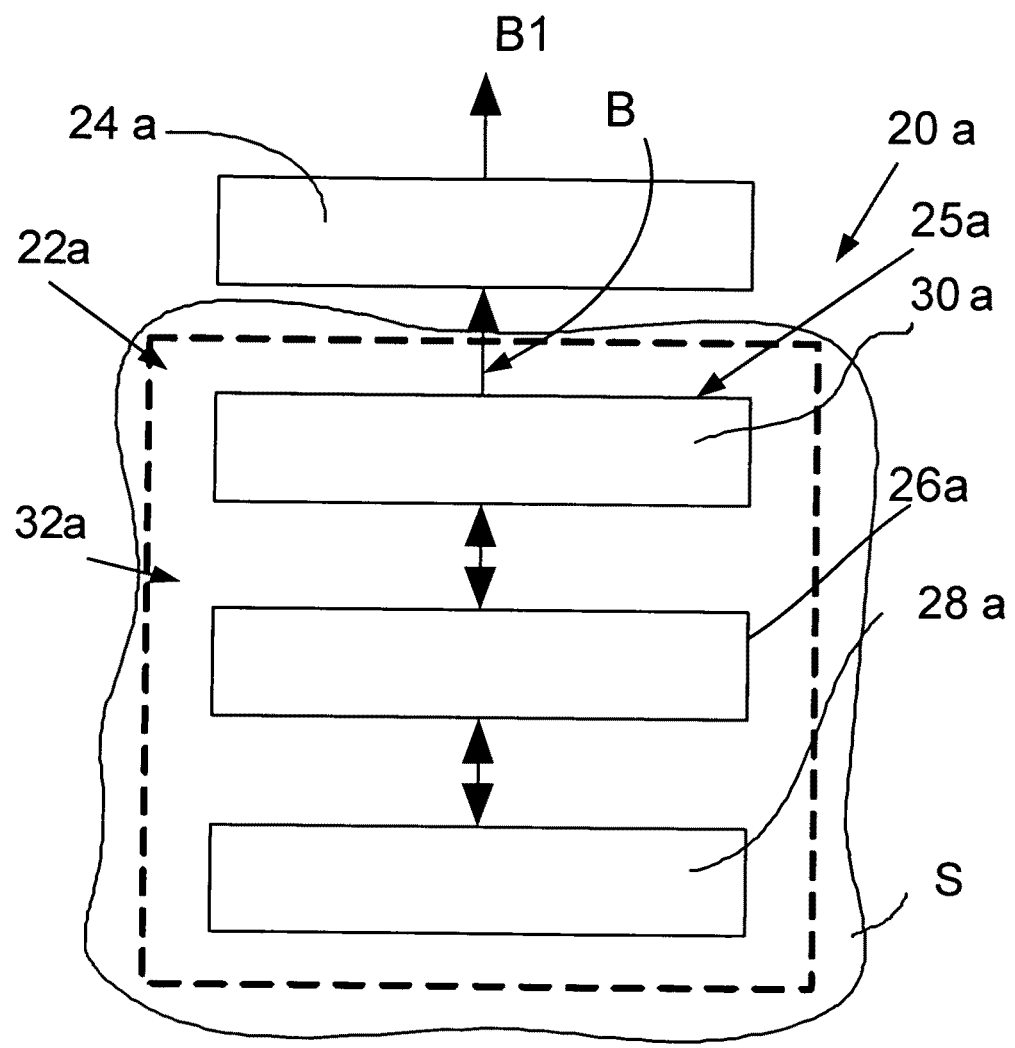
FIG. 1A is a block diagram of a conventional optical system with a multimode lasing medium and with collimating optics.

FIG. 1A is a block diagram of a conventional optical system 20a with a multimode wide-aperture laser diode 22a and with collimating optics 24a. The multimode laser diode 22a comprises a lasing medium 26a and is located between a partially reflecting output mirror 30a and a fully reflecting mirror 28a. In the structure of the multimode laser diode 22a, the mirrors 28a and 30a form an optical resonator (cavity) 32a. Reference numeral 25a designates an emitter of the laser diode 22a located on the outer side of the partially reflecting mirror 30a. All of these parts are mounted on a submount S. In the resonator 32a, the light applied from the laser-active medium 26a bounces back and forth between the mirrors 28a and 30a, enhancing stimulated emission. The beam B that is sent from the laser diode 22a is collimated by the optics 24a, thus producing a collimated output beam B1 (FIG. 1A).

The system 20a described above and shown in FIG. 1A is a well-known structure used in the lasing medium technique. The inventor herein has found that in addition to light reflection, one or both mirrors 28a and/or 30a can impart to the system 20a a new function, i.e., the function of an optical-mode reorganizer, which provides intercoupling of all modes of the beam of a lasing medium 26a in order to stabilize the radiating wavelength, to synchronize phases, and to reorganize mode structure by suppressing high-order modes and gaining low-order modes with lower divergence or even a single mode with lowest divergence, thus increasing brightness of the output beam B.

Figure 1B:
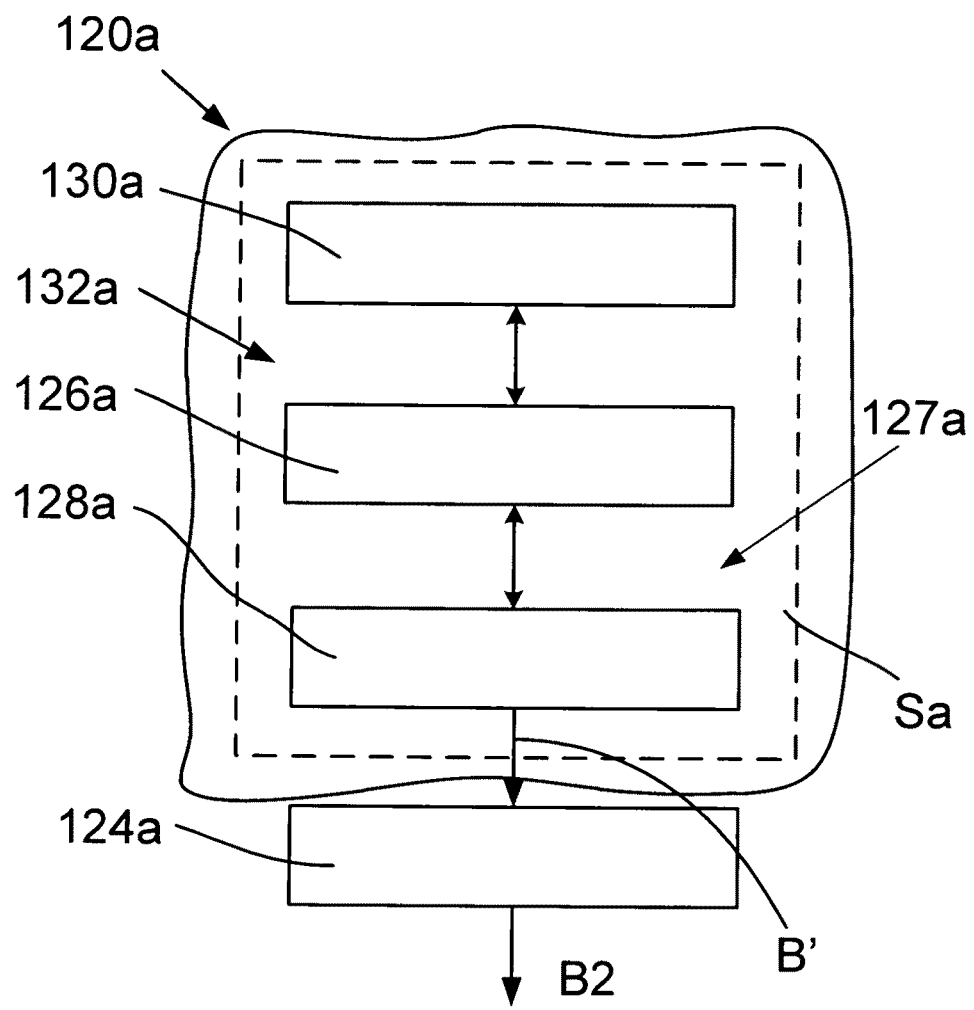
FIG. 1B is a block diagram of the mode-reorganizing optical system of the invention, wherein the DPH-mode reorganizer functions as a fully reflecting mirror and is located at the closed end of the resonator.

Furthermore, according to the invention, system components used to accomplish the aforementioned beam-reorganizing function and other functions can be embodied as DPH optical components formed as digital holograms generated in a computer and embedded into planar waveguides by standard mass-production method, such as binary nanolithography or nanoimprinting. As a result, a mode-reorganizing system 120a of the type shown in FIG. 1B may be obtained. In the context of the present invention, the term "mode-reorganizing system" covers an assembly comprising an optically active lasing medium, a planar waveguide that contains a DPH-mode reorganizer, and at least one fully reflecting mirror.

In the mode-reorganizing system 120a of the invention, the mode-reorganized optical-beam components that are similar to those shown in FIG. 1A are designated by the same reference numerals but with the addition of 100. For example, the system 120a comprises a lasing medium 126a and an output optical unit 124a that manages the beam B2 emitted from the lasing medium 126a and produces the output beam B' (FIG. 1B) from an output end 127a of the system. In distinction from the conventional system 20a of FIG. 1A, the system 120a incorporates a mode reorganizer 130a made in the form of a DPH device, hereinafter referred to as "DPH-mode reorganizer." The lasing medium 126a is placed on the same basic support plate Sa on which the DPH-mode reorganizer 130a that accomplishes the aforementioned new functions (i.e., the functions of reorganizing modes of the multimode laser and gaining some of them) is placed in order to narrow the radiating space spectrum, to improve synchronization of the mode phases of all modes, and to reorganize the modes so that the side modes are suppressed while the low-order modes, or mode, are gained. In other words, after integration on the support plate Sa, the laser-active medium 126a and the DPH-mode reorganizer 130a form a single optical chip. Optical coupling and interaction between the lasing medium 126a and the DPH-mode reorganizer 130*a* are carried out through the well-known method of optical butt connection between two laser media.

The system 120*a* also incorporates a partially reflecting mirror 128*a*. The lasing medium 126*a*, the DPH-mode reorganizer 130*a*, and the partially reflecting mirror 128*a* form an optical resonator 132*a*. In the resonator 132*a*, the light applied from the laser-active medium 126*a* bounces back and forth between the DPH-mode reorganizer 130*a* and the partially reflecting mirror 128*a*, thereby enhancing stimulated emission. Thus, in addition to its main function of mode selection, the DPH-mode reorganizer 130*a* accomplishes the function of a fully reflecting mirror.

In addition to the above, the DPH-mode reorganizer 130*a* participates in bouncing of the light beam back and forth and in aforementioned reorganization of the modes by suppressing the side modes and gaining the low-order modes, or mode. As a result, output radiation acquires coherency and increased brightness due to decrease in spatial divergence.

In the system 120*a*, the DPH-mode reorganizer 130*a* has a complicated hierarchical structure, which in approximation can be considered substantially as a pattern consisting of standard binary nanofeatures (for example, etched grooves of a rectangular shape) formed in a planar waveguide in order to modulate its effective refractive index. Each binary nanofeature is defined by three dimensions: width, length, and depth. The width and depth of these nanofeatures are shorter than the laser wavelength of radiation interacting with the aforementioned grooves.

As the light beam is confined inside the planar waveguide, it is forced to propagate through and optically interact with the DPH structure and to rebounce back. This results in mode reorganization that leads to suppression of high-order modes and hence to increase in brightness of the output beam emitted from the system. The DPH represents a binary structure with the main Fourier component k which is close to the doubled wave vector of the laser light. The Fourier expansion of any binary structure exhibits higher modes, but the most important are Fourier satellites close to the main component. These satellites provide a reflected wave having the shape of the first lateral mode or any other desirable distribution. In first approximation, binary lines are positioned in the imaginary traces of interference fringes that are created by the undesirable multimode light emitted from the laser. This light has a lateral first diverging mode and many converging modes. All of these modes have the same phase on the facet of the laser gain section (lasing medium). It is understood that since a hologram is formed by millions of elements, these elements can be combined and grouped into many specific patterns.

According to the method of the present invention, each DPH-mode reorganizer is formed as a combination of holographic elements, e.g., nanogrooves embedded into the planar waveguide for periodical modulation of its refractive index. The modulating function is calculated based on optical-transfer functions, desirable in said reorganizer and implemented by standard mass-production methods such as nanolithography or nanoimprinting. Numerous nanofeatures (e.g., in an amount of $10^5$-$10^6$) can be aggregated into multiple patterns, each of which is responsible for an optical-transfer function.

Each pattern is a group of DPH features specifically selected to accomplish a predetermined function from multiple functions of the DPH-mode reorganizer. All patterns are superimposed on the same planar area, forming a final pattern that performs all desired functions.

Each final pattern is generated as a mathematical superposition of elliptic, parabolic, or hyperbolic patterns, with a spatial period of an approximate one-half wavelength according to the following method. The first to be created is a two-dimensional analog-generating function A(x,y) representing a superposition of modulation profiles of the refractive index. Each modulation function corresponds to the equivalent of a pattern. Determined in this step is a two-dimensional-generating function A(x,y) that resembles the profile of a refractive index in a planar waveguide corresponding to desired optical transfer functions to be implemented.

The next step is binarization of the two-dimensional analog-generating function A(x,y), which was produced in the previous step. Binarization is achieved by applying a threshold value and assigning 1 to all areas above the predetermined threshold and 0 to the remaining areas in order to obtain a digital, two-dimensional-generating function B(x,y).

Next, the complex shape islands in B(x,y) with the value of 1 are simplified for presentation as a combination of standard microlithographic or nanolithographic features (short and straight grooves). This is accompanied by conversion to function C(x,y).

The last step is lithographic fabrication of the standard nanofeatures by microlithography or nanoimprinting as function C(x, y) to a calculated depth on a planar waveguide.

Figure 2C:
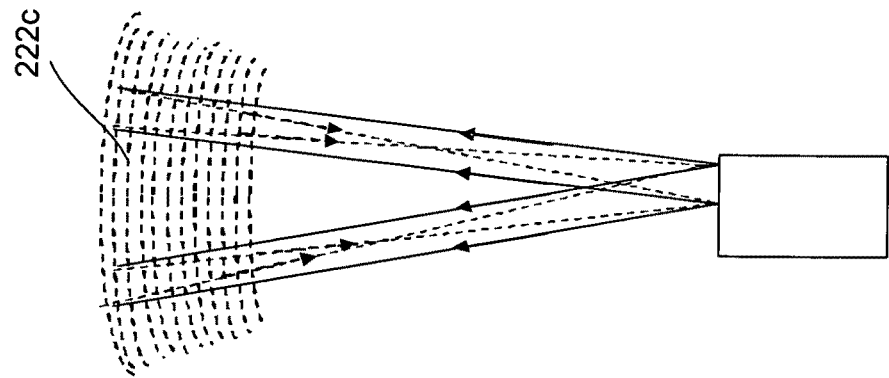
Figure 2B:
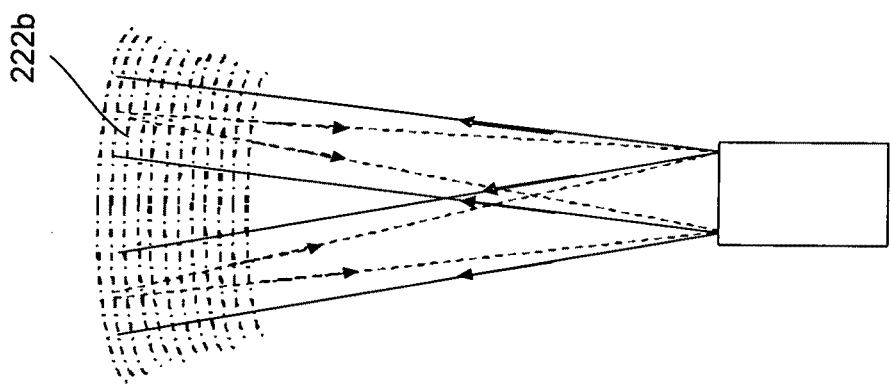
Figure 2A:
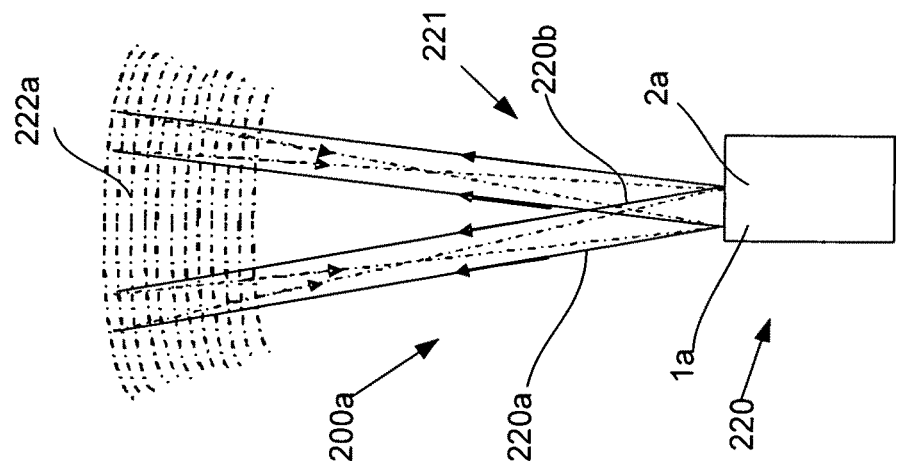
Figure 2F:
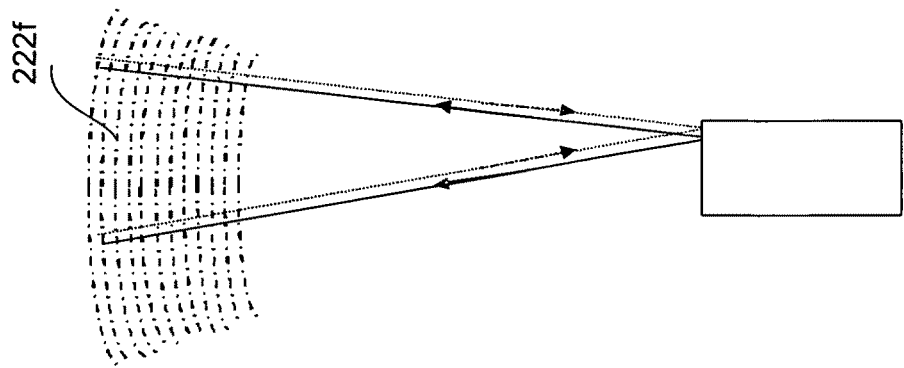
Figure 2E:
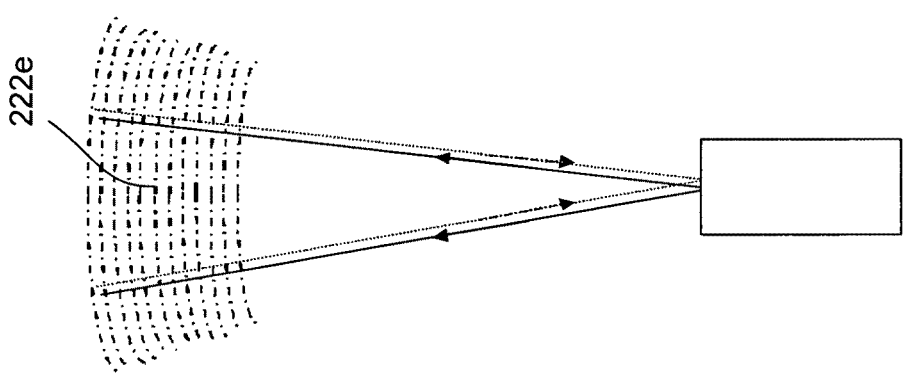
Figure 2D:
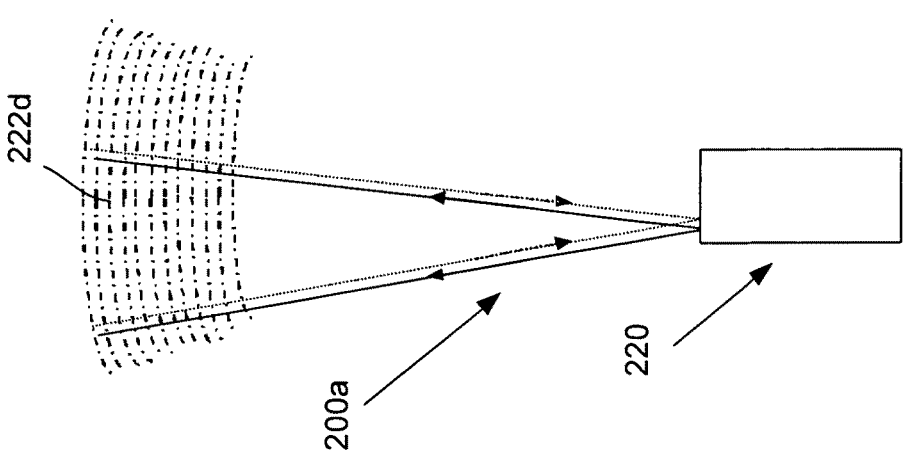
Figure 2G:
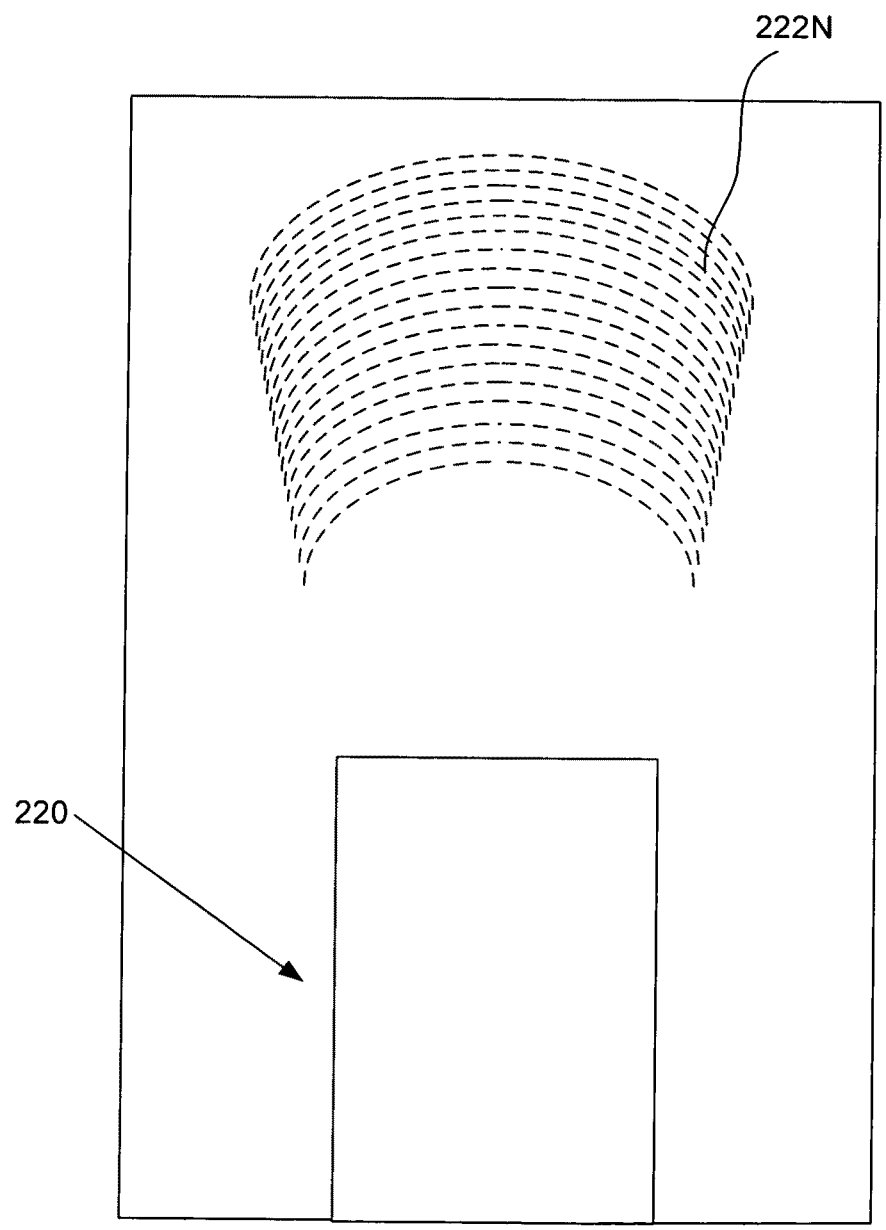

Specific examples of the structures of the mode-reorganizing system according to the invention is shown in FIGS. 2A, 2B, 2C, 2D, 2E, 2F, and 2G, which are simplified schematic top views of the system according to the invention. The drawings illustrate interaction of the selected modes of laser radiation by using respective patterns of the DPH-mode reorganizer, wherein FIG. 2G illustrates the final pattern obtained by interposing the aforementioned respective patterns of FIGS. 2A, 2B, 2C, 2D, 2E, and 2F.

More specifically, each drawing (FIGS. 2A, 2B, 2C, 2D, 2E, and 2F) illustrates interaction of the selected modes of the laser radiation with respective patterns, which, in reality, are combined into the single final pattern shown in FIG. 2G. In other words, in each respective drawing, the system as a whole is designated by reference numeral 200*a* and consists of a multimode laser 220 and respective patterns selected from patterns 222*a* through 222*f*.

The lasing medium of a multimode laser 220 emits a multimode beam 221 that has a complicated structure consisting of several modes. The output beam can be presented as a combination of subbeams radiated by narrow active regions that form the lasing medium. The width of these regions is selected so that the subbeam from each region is a single-mode beam. The subbeams 220*a* and 220*b* of the multimode beam 221 propagate to the final pattern and are reflected by pattern 222*a* in a planar waveguide so that the corresponding regions or subvolumes 1*a* and 2*b* of the active medium are intercoupled (FIG. 2A). As a result, the subvolumes emit single-mode beams which would not be of the same mode if they were not intercoupled, but the intercoupling forces them to generate the same mode of radiation. Ideally, the output beam will have the same parameters as from one single-mode region, but its power will be doubled. Accordingly, the brightness of the combined intercoupled beam is also doubled. In reality, it will not be a factor of two because of inevitable losses associated with intercoupling, but the enhancement factor will be close to 2 because the losses can be minimized by using a high-transparency waveguide and low-loss butt-coupling.

As known, a single-mode laser resonator should satisfy the following condition:

$$a^2/(\lambda*L)<1, \tag{1}$$

where a is the laser aperture, $\lambda^*$ is radiation wavelength (inside the resonator), and L is the resonator length.

In accordance with formula (1), the size of the single-mode region in the wide-aperture laser diode can be calculated. The total number of single-mode regions N can be estimated as:

$$N=A/a, \quad (2)$$

where A is the width of a wide-aperture active medium, and $$a<(\lambda^* L)^{0.5} \quad (3)$$

For typical values of parameters a and A, the number of single-mode subregions ranges from N~3÷30. Parameter N determines the number of patterns to be superimposed to form the final pattern.

Consider, for example, an imaginary laser that radiates a three-mode beam, wherein each mode corresponds to a subbeam. FIGS. 2A, 2B, 2C, 2D, 2E, and 2F illustrate operation of a system that contains a grating consisting of six pattern 222a, 222b, 222c, 222d, 222e and 222f, respectively, shown in separate drawings. In FIG. 2A, the subbeam 220a corresponds to a region 1a, and the subbeam 220b corresponds to a region 2b. For simplicity, designations of subbeams in FIGS. 2B, 2C, 2D, 2E, and 2F are omitted but are shown in Table 1, which lists the intercoupling of subbeams with each other in the resonator (not shown in FIGS. 2A to 2F),

TABLE 1

Subbeams Intercoupled by Corresponding Patterns

| Pattern | 222a | intercoupled subbeams | 220a and 220b |
|---|---|---|---|
| | 222b | | 220a and 220c |
| | 222c | | 220b and 220c |
| | 222d | | 220a to itself |
| | 222e | | 220b to itself |
| | 222f | | 220c to itself |

All patterns are superimposed on the same planar area, forming a final pattern, where each feature works toward the best synergistic performance of all desired functions. In general, for the structure shown in FIG. 3G with final pattern 222N and N single-mode regions, generating single-mode subbeams $220a'$, $200b'$, and $220c'$ through $220n'$, the required number of patterns can be calculated in the following way:

subbeam $220a'$ needs to be coupled with N modes (including itself), subbeam $220b'$ needs to be coupled with N−1 modes because it has already been coupled with mode $220a'$, subbeam $220c'$ needs to be coupled with N−2 modes because it has already been coupled with modes $220a'$, $220b'$, and so on;

finally, subbeam $220n'$ needs to be coupled with itself only because it has already been coupled with all other subbeams.

Therefore, the total number of patterns m is the sum of the arithmetic progression:

$$m=N+(N-1)+(N-2)+\ldots+1, \quad (4)$$

i.e., $$m=0.5N(N+1) \quad (5)$$

As mentioned, a DPH-mode reorganizer can be used as a fully reflecting resonator mirror or as a partially reflecting mirror. Such modification can be provided by varying the length of the DPH-mode reorganizer; short final patterns reflect only partially, and the reflection coefficient grows with structure length and after becoming saturated does not depend on additional increase in length, i.e., forms a fully reflecting component.

As follows from the above formula (5), with increase in size of the laser aperture. the number of patterns grows in arithmetic progression.

Figure 3:
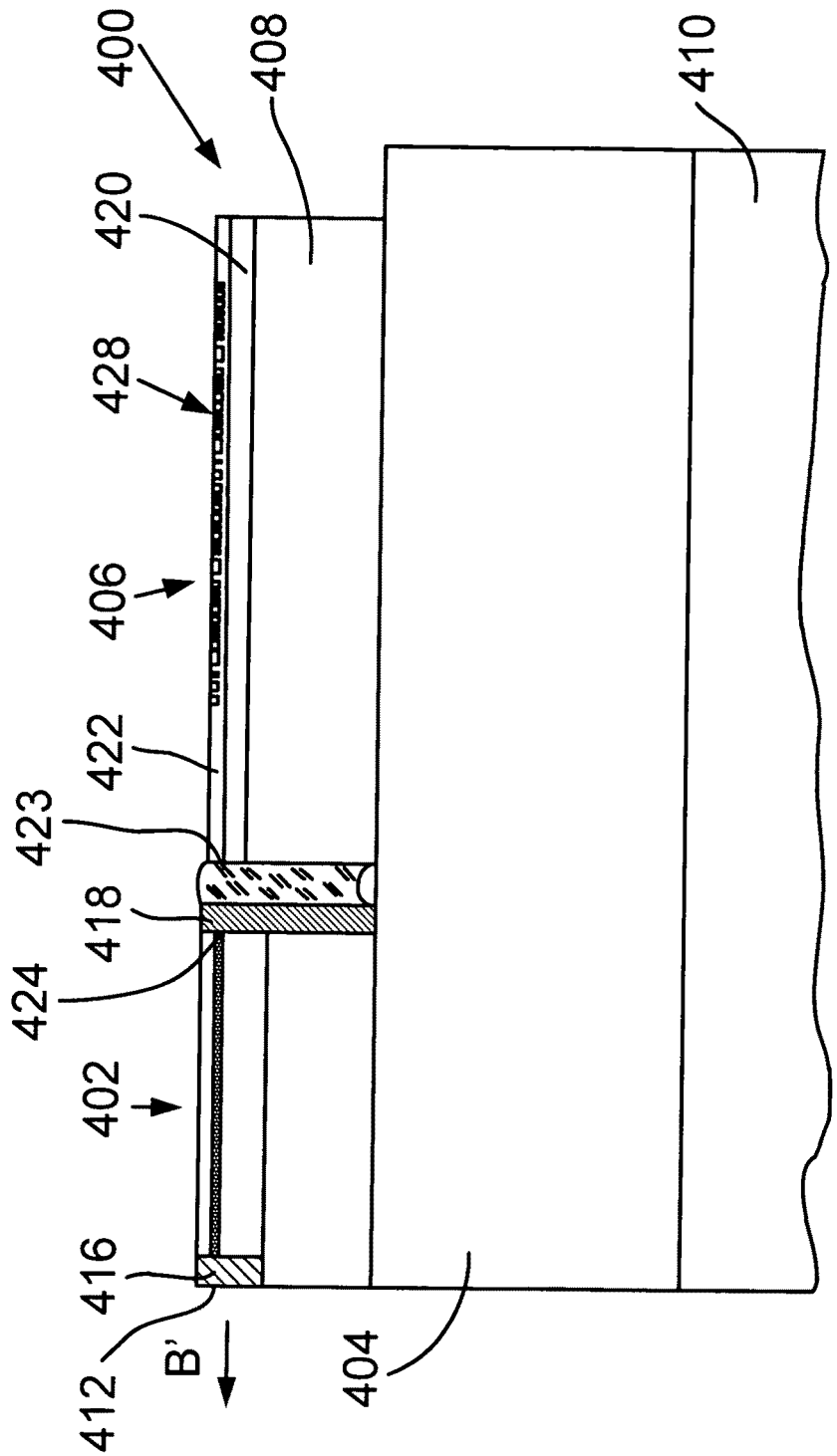
FIG. 3 is a side sectional view of the light-enhancing device according to the invention, wherein the DPH-mode reorganizer is used as a fully reflecting mirror.
Figure 5:
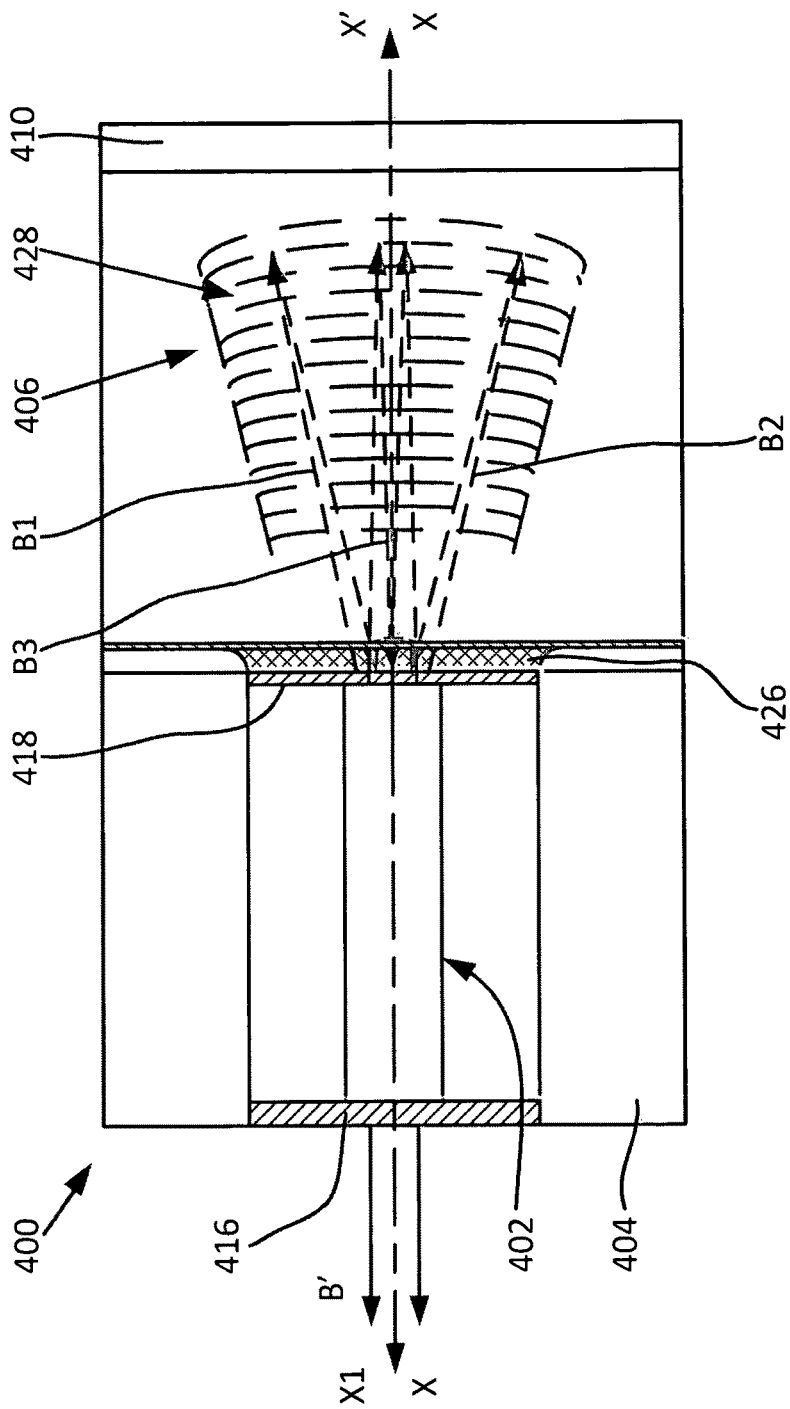
FIG. 5 is a plain view of the light-enhancing device according to the invention, wherein the DPH-mode reorganizer is used as a fully reflecting mirror.

FIG. 3 is a sectional view of a light-enhancing device of the invention, which, as a whole, is designated by reference numeral 400. FIG. 5 is a top view of the device shown in FIG. 3. The device 400 comprises a lasing medium 402 installed on a substrate submount 404 made, e.g., of silicon, and a specific DPH-mode reorganizer 406, which is formed on a silicon substrate 408 according to specific application of the device. Both units 402 and 406 are supported by a mounting plate 410 that also can be made of a suitable material of high thermal conductivity, such as ceramic.

In combination with mirrors, as described below, the lasing medium 402 radiates a multimode light beam and has a relatively wide emitter 412 with a width ranging from about 10 microns to several hundred microns. The height of the emitter ranges from about 0.2 nm to several microns. The active lasing medium 402 (FIG. 3) is limited on one side with a partially reflective mirror 416 and on the other side with the end 424 having a coating 418 that has a very low coefficient of reflection (R<0.1%).

The DPH-mode reorganizer 406 is supported by a silicon substrate 408 and comprises: (1) a lower cladding layer 420 (e.g., of $SiO_2$) that rests on the silicon substrate 408 and has a thickness in the range of several to several tens of microns; and (2) a core 422 that is placed onto the lower cladding made of $SiO_2$ and is formed by doping with a material such as germanium that changes the refraction index by 1 to 5%. The core has a thickness, e.g. of several tens nanometers to one micron and a refractive index greater than that of the cladding (FIG. 3).

If necessary, an upper cladding with a refractive index lower than that of the core can be placed onto the core 422. DPH-mode reorganizer 406 (shown in FIG. 3) is configured as a fully reflective mirror, while a partially reflecting mirror 416 functions as an emitter of the lasing medium 402. An antireflective coating 418 is placed between the DPH-mode reorganizer 406 and the lasing medium 402. The lasing medium 402, the DPH-mode reorganizer 406, and the partially reflecting mirror 416 form a resonator. Reference numeral 426 designates a high-transparency medium (optical glue or optical gel) that fills the space between the antireflective coating 418 and the DPH input/output end 423. The transparent medium (optical glue or optical gel) 426 has a refractive index close to the refractive index of the core 422. Coupling between the DPH input/output end 424 and the end 424 of the lasing media 402 is carried out through the well-known method of optical butt connection between two optical planar waveguides.

The core 422 of the DPH-mode reorganizer 406 comprises a plurality of holographic elements, hereinafter referred to as "elements", in the form of grooves 428 with a depth of less than the thickness of the core. Preferably, the elements are rectangular grooves produced as binary nanofeatures suitable for reproduction by methods of nanolithography or nanoimprinting.

Figure 4C:
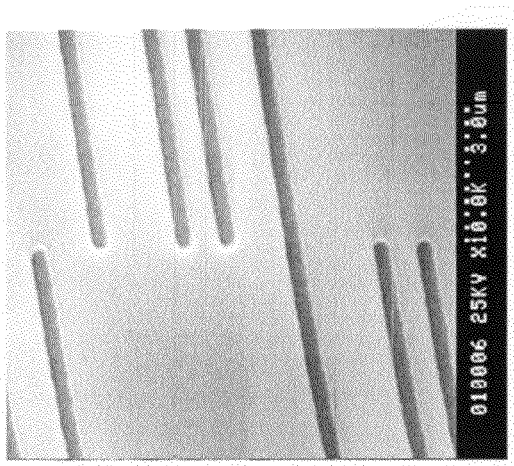
FIG. 4C is a photograph of the elements of the patterns shown in FIGS. 4A and 4B obtained with the use of an electronic microscope (scale is shown in the lower part of the picture).
Figure 4B:
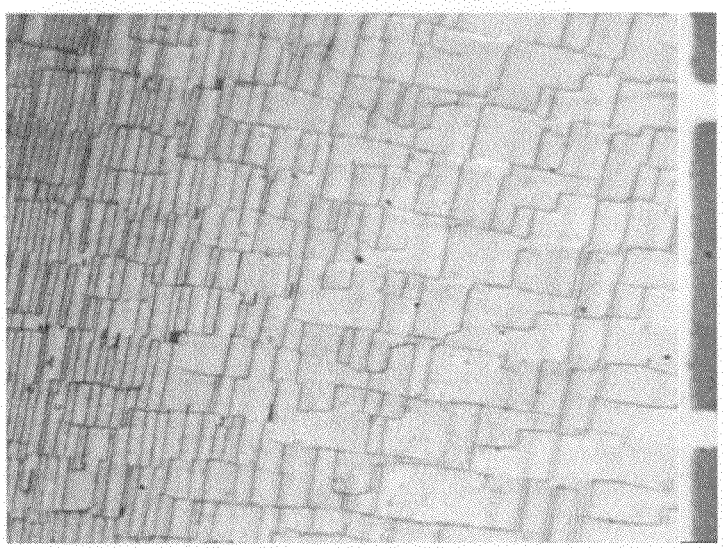
FIG. 4B shows the same pattern of the elements shown under magnification 200× magnification.
Figure 4A:
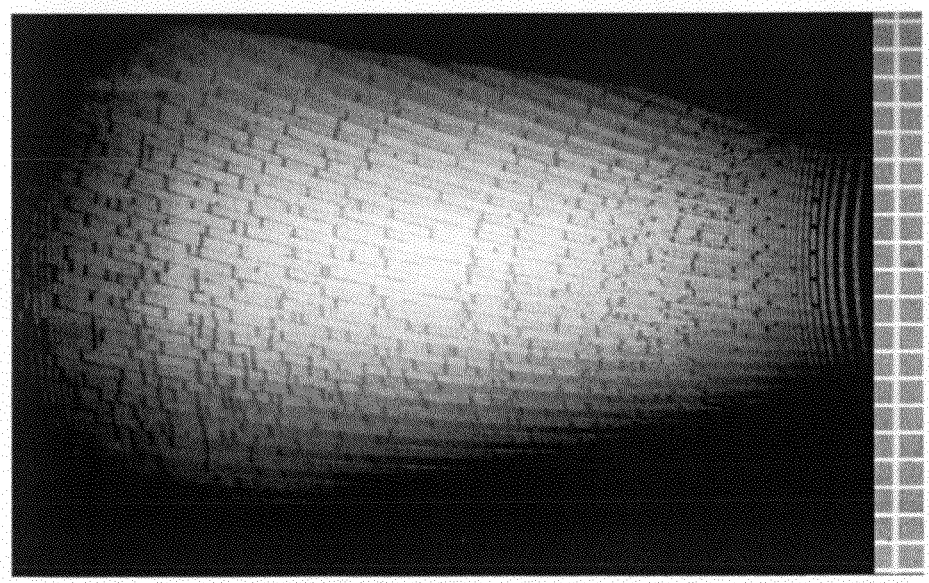
FIG. 4A is a 20× photograph that shows an example of the final pattern of the elements of the DPH-mode reorganizer of FIG. 2G obtained with the use of an optical microscope.

As mentioned above, the number of such elements can exceed $10^6$. The total surface area occupied by these elements on the surface of the core is several $mm^2$. Shown in FIGS. 4A, 4B, and 4C are examples of patterns of elements in a DPH-mode reorganizer that is used as a fully reflecting mirror. FIG. 4A is a 20× photograph of the pattern surface of the DPH-mode reorganizer taken with an optical microscope. FIG. 4B shows the same pattern of the elements or grooves 428 under 200× magnification, and FIG. 4C shows the elements or grooves 428 under even greater magnification obtained with an electronic microscope (the scale is shown in the lower part of the picture). The pictures in FIGS. 4A, 4B, and 4C demonstrate that pattern topology is not of a periodic nature, i.e., the grooves 428 (FIG. 3) are equal in width but different in length and have explicitly nonuniform distribution density. The DPH grooves 428 locally change the refractive indices of the core. Since the dimensions of the elements do not exceed the wavelength, the density of the elements on the core surface can be used to control the density of the light beam. This means that the light beams B1, B2, and B3 (FIG. 5) that enter the DPH-mode reorganizer 406 from the lasing medium 402 and are processed by the DPH-mode reorganizer 406 are converted into a beam B having desired parameters defined by specific application of the device 400 as a whole.

During operation of the device 400, light emitted from the lasing medium 402 bounces back and forth in the resonator between the partially reflecting mirror 416 of the lasing medium 402 and the DPH-mode reorganizer 406, which is configured as a fully reflecting mirror with the function of gaining low-order modes, or mode, by suppressing the side modes, thus increasing brightness of the light beam B emitted from the system.

As mentioned above, the lasing medium 402 and the DPH-mode reorganizer 406 are both mounted on a common base plate 410 made of, e.g., Si, $SiO_2$, or quartz. To stabilize temperature in laser media of high power, the common base plate 410 can be made from a material of high thermal conductivity on a thermoelectric cooler. The lasing medium 402 and the DPH-mode reorganizer 406 are mounted on the base plate 410 so that the optical axis X-X of the lasing medium 402 is aligned with the optical axis of the core and the respective axis of the hologram, e.g., the symmetry axis X1-X1. The light beams, B1, B2, and B3 enter the DPH-mode reorganizer 406 from the lasing medium 402 through an optical glue or optical gel layer 426 with a refractive index close to that of the core 422.

In a conventional lasing medium having the above-described geometry with a partially (<10%) reflecting mirror and a fully reflecting mirror instead of the above-described DPH-mode reorganizer 406, the output beam B (FIG. 1A) will have several tens or even hundreds of different modes that have different intensities. Only some of these modes, e.g., several to ten modes, will have approximately the same intensity. Therefore, in the far field, the beams B emitted by the laser, such as the laser diode 22a in FIG. 1A, will have significant divergence in the direction of the slow axis and wide distribution of radiation consisting of a large number of different modes. On the other hand, divergence in the direction of the fast axis may reach even several tens of degrees or more.

Figure 6:
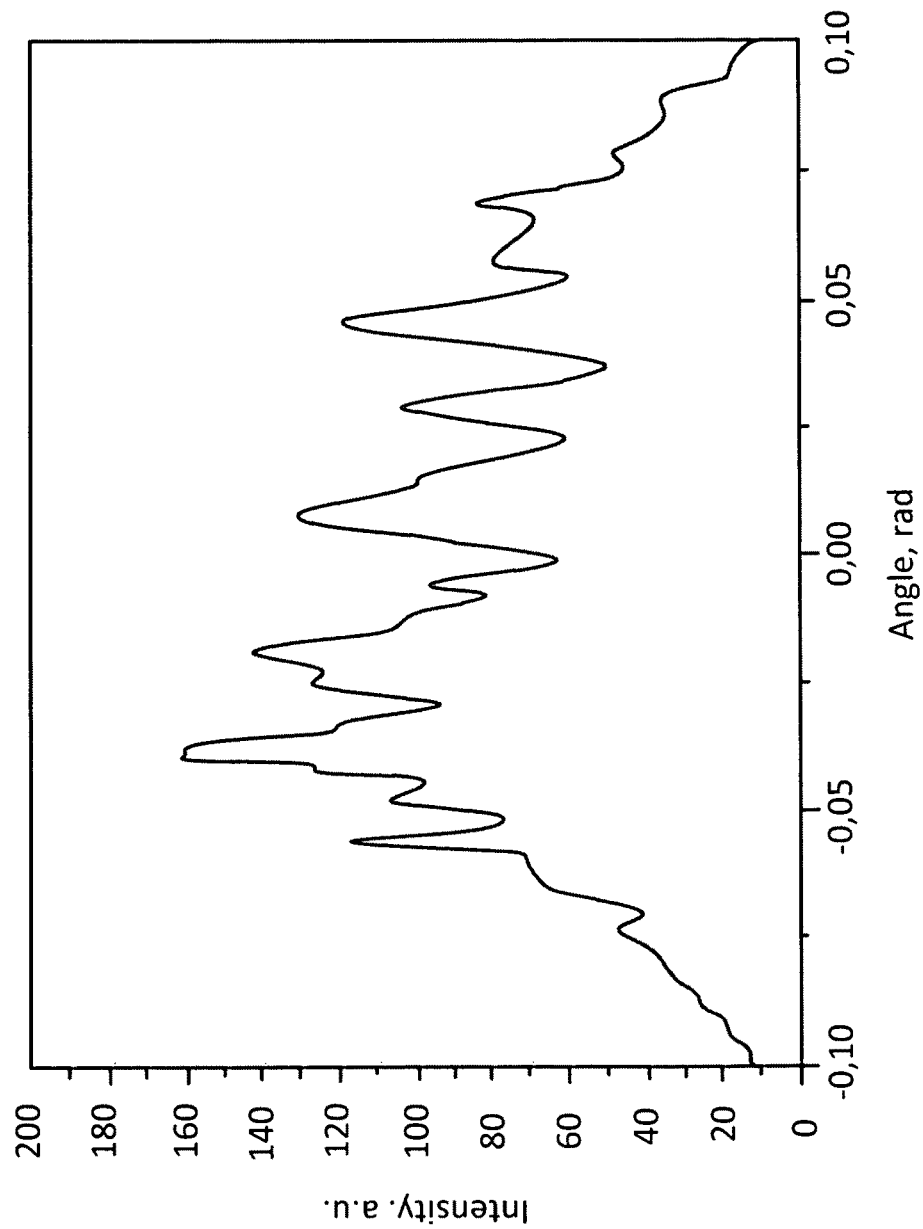
FIG. 6 is a graph illustrating angular dependence of light-intensity distribution in the far field for the conventional system shown in FIG. 1A
Figure 7:
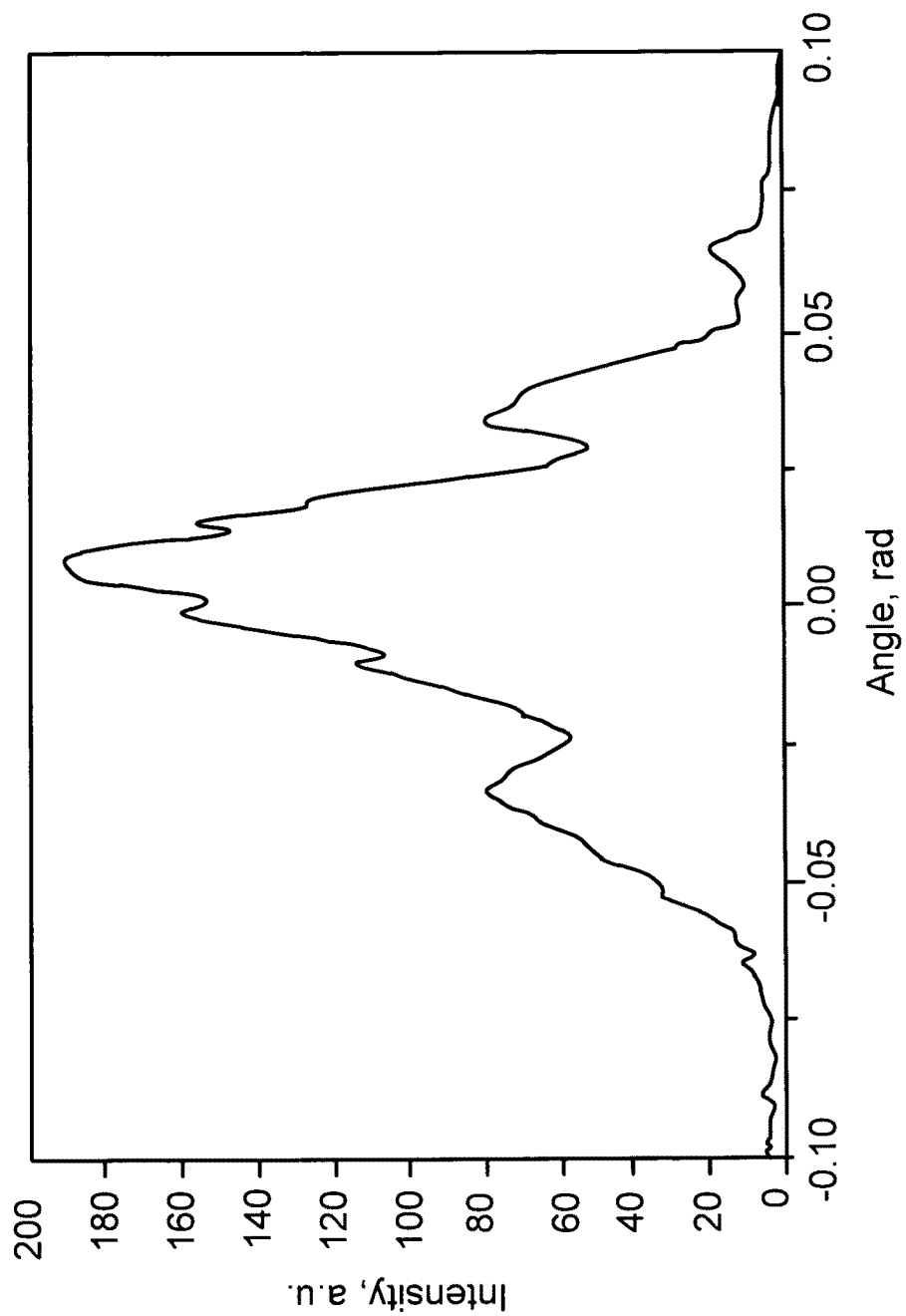
FIG. 7 is a graph illustrating angular dependence of light-intensity distribution in the far field for the system of the invention (shown in FIG. 1B, FIG. 3, and FIG. 5), which incorporates the DPH-mode reorganizer.

The situation is dramatically changed when the fully reflecting mirror is replaced with the specific DPH-mode reorganizer 130a of the invention, as described above. This situation occurs because the DPH-mode reorganizer 130a converts the multimode beam into a beam with far fewer space modes. This is shown in FIGS. 6 and 7, which illustrate angular dependence of light-intensity distribution in the far field. FIG. 6 corresponds to the system of FIG. 1A, and FIG. 7 corresponds to the system of FIG. 1B, FIG. 3, and FIG. 5 for the same lasing medium as in FIG. 1A but in combination with the DPH-mode reorganizer 130a of the invention.

The wide-aperture laser diode manufactured by the method of the invention was experimentally tested as described below.

The radiation field of the wide-aperture laser diode 22a in the far-field region is shown in FIG. 6. It has a multimode structure with 8 to 10 modes having angular divergence of 20° in the direction of the slow axis.

On the other hand, it can be seen in FIG. 7 that coupling with the DPH-mode reorganizer 130a (FIGS. 1B, 3, and 5) dramatically changes the structure of the output beam; a powerful low-order mode is formed, and the major part of the output light power of the laser is concentrated in this low-order mode, while a much smaller part of laser power is held by two side modes. Therefore, the total number of modes is significantly reduced to three and can be even further reduced to a single-mode structure after refining the design of the DPH-mode reorganizer. For the system of the invention, such mode-distribution pattern is typical for the far field. Angular divergence in the direction of the slow axis is reduced four-fold, i.e., from 20° to 5°.

Thus, the method of the invention for manufacturing a laser diode with improved light-emitting characteristics comprises the following steps:

providing a wide-aperture lasing medium that has an active emitting layer with a first end and a second end, a DPH-mode reorganizer that comprises a core, at least one cladding, and a plurality of nanofeatures made in the core in the form of holographic elements having less depth than the thickness of the core and smaller dimensions than those of the half-wavelength of light can be emitted by the lasing medium, the nanofeatures being arranged in a pattern that accomplishes a given function and locally changes the refractive index of the core; forming a semitransparent mirror on the second end; aligning the first end of the active emitting layer with the core of the DPH-mode reorganizer, thus forming a resonator.

The aforementioned laser diode with improved light-emitting characteristics is formed essentially from the lasing medium, the DPH-mode reorganizer that functions as a nontransparent mirror on the first end of the active emitting layer, and a semitransparent mirror on the second end that emits light of improved characteristics emitted from the laser.

Although the invention has been shown and described with reference to specific embodiments, these embodiments should not be construed as limiting the areas of application of the invention and any changes and modifications are possible provided that these changes and modifications do not depart from the scope of the attached patent claims. For example, the system cannot contain mirrors but instead can contain two DPH beam combiners functioning as respective mirrors. Replacement of all mirrors with the DPH structures of this invention applies to all combinations of the system examples described above.

The invention claimed is:

1. A method for manufacturing a laser diode with improved light-emitting characteristics, comprising the following steps:

providing a wide-aperture lasing medium that has an active emitting layer with a first end and a second end, a DPH-mode reorganizer that comprises a core having a thickness, at least one cladding, and a plurality of nanofeatures made in the core in the form of holographic elements having a depth less than the thickness of the core and smaller dimensions than those of the half-wavelength of light that can be emitted by the lasing medium, the nanofeatures being arranged in a pattern that accomplishes a given function and locally changes the refractive index of the core;

forming a semitransparent mirror on the second end; and aligning the first end of the active emitting layer with the core of the DPH-mode reorganizer, thus forming a resonator.

2. The method of claim 1, wherein the nanofeatures comprise grooves cut in the core of the DPH-mode reorganizer.

3. The method of claim 2, wherein the grooves are straight grooves that can be produced as binary features by methods of nanolithography or nanoimprinting.

4. The method of claim 1, comprising the step of arranging the nanofeatures in a pattern that accomplishes a given function and locally changes the refractive index of the core.

5. The method of claim 2, comprising the step of arranging the grooves in a pattern that accomplishes a given function and locally changes the refractive index of the core.

6. The method of claim 3, comprising the step of arranging the grooves in a pattern that accomplishes a given function and locally changes the refractive index of the core.

7. The method of claim 1, wherein the first end of the active emitting layer is aligned with the core of the DPH-mode reorganizer in but connection.

8. The method of claim 3, wherein the first end of the active emitting layer is aligned with the core of the DPH-mode reorganizer in but connection.

9. The method of claim 5, wherein the first end of the active emitting layer is aligned with the core of the DPH-mode reorganizer with but connection.

\* \* \* \* \*